(12) United States Patent
Rümpler

(10) Patent No.: US 9,192,064 B2
(45) Date of Patent: Nov. 17, 2015

(54) ELECTRONIC MODULE FOR AUTOMATION ENGINEERING

(71) Applicant: Hannes Rümpler, Amberg (DE)

(72) Inventor: Hannes Rümpler, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 197 days.

(21) Appl. No.: 13/945,665

(22) Filed: Jul. 18, 2013

(65) Prior Publication Data
US 2014/0022741 A1    Jan. 23, 2014

(30) Foreign Application Priority Data

Jul. 19, 2012    (EP) ..................................... 12177037

(51) Int. Cl.
    *H05K 5/03*        (2006.01)
    *H05K 7/14*        (2006.01)

(52) U.S. Cl.
    CPC ................ *H05K 5/03* (2013.01); *H05K 7/1468* (2013.01); *H05K 7/1481* (2013.01)

(58) Field of Classification Search
    CPC ...... H05K 5/03; H05K 7/1468; H05K 7/1481
    USPC .................. 361/747; 455/575.1, 575.3, 575.8
    See application file for complete search history.

(56) References Cited

U.S. PATENT DOCUMENTS

| | | | | |
|---|---|---|---|---|
| 5,933,330 | A * | 8/1999 | Beutler et al. | 361/814 |
| 6,708,046 | B1 * | 3/2004 | Takagi | 455/575.3 |
| 7,596,358 | B2 * | 9/2009 | Takagi | 455/90.3 |
| 8,238,843 | B2 * | 8/2012 | Nakao et al. | 455/90.3 |
| 8,483,783 | B2 * | 7/2013 | Kanazawa et al. | 455/575.3 |
| 8,711,576 | B2 * | 4/2014 | Goro et al. | 361/814 |
| 2011/0222260 | A1 * | 9/2011 | Goro et al. | 361/814 |

FOREIGN PATENT DOCUMENTS

| | | |
|---|---|---|
| DE | 93 19 488 U1 | 2/1994 |
| DE | 198 22 564 A1 | 12/1999 |
| DE | 10 2010 047 632 A1 | 4/2012 |
| EP | 0 341 751 A2 | 11/1989 |

* cited by examiner

*Primary Examiner* — Hung S Bui
*Assistant Examiner* — Michael Matey
(74) *Attorney, Agent, or Firm* — Cozen O'Connor

(57) ABSTRACT

An electronic module includes a housing, a back and a front, wherein the back is configured with a retainer for latchment in a support system and a movable cover connected to the housing is disposed at the front, a receptacle is disposed in a top region of the front of the housing, the receptacle is configured to receive a first hinge piece of a hinge, with a latching mechanism, connecting the housing and the cover, the cover is configured at a first end as a second hinge piece of the hinge, a first opening is disposed perpendicular to a longitudinal axis of the cover at the first end in an enclosure of the cover into which an axial casing is inserted, and the first hinge piece has a second opening into which a partial region of the axial casing is inserted to form an axis of rotation of the hinge.

5 Claims, 4 Drawing Sheets

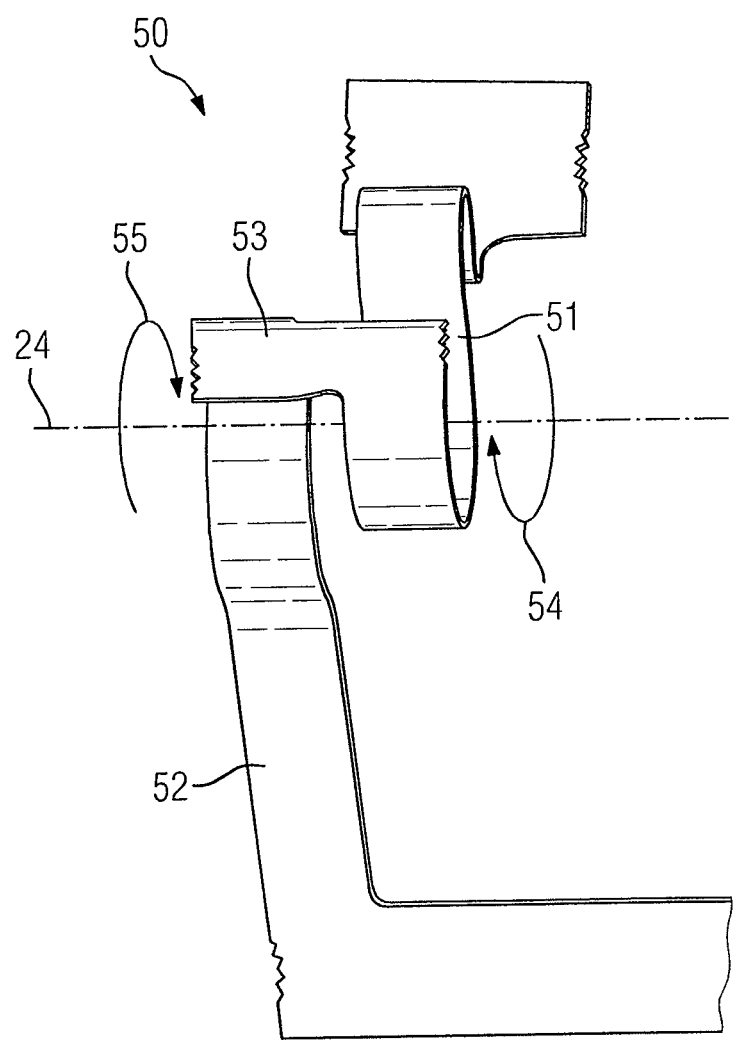

ELECTRONIC MODULE FOR AUTOMATION ENGINEERING

BACKGROUND OF THE INVENTION

Field of the Invention

The invention relates to an electronic module for automation engineering, having a housing, a back and a front, where the back is configured with a retaining device for latching in a support system and a movable cover connected to the housing is disposed at the front.

SUMMARY OF THE INVENTION

It is an object of the invention to provide an electronic module with a cover, where it is possible to form a force-fit and torque-resistant connection between the cover and the module by a design measure involving the housing parts (cover and housing of the module).

This and other objects and advantages are achieved in accordance with the invention by an electronic module electronic module in which a receptacle is disposed in a top region of the front of the housing, where the receptacle is configured to receive a first hinge piece of a hinge, with a latching mechanism, connecting the housing and the cover, and where the cover is configured at a first end as a second hinge piece of the hinge, a first opening into which an axial casing is inserted is provided being for this purpose and disposed in an enclosure of the cover perpendicular to a longitudinal axis of the cover at the first end, where the first hinge piece has a second opening into which a partial region of the axial casing is inserted to form an axis of rotation of the hinge, and where it is possible to rotate the cover as a movable front flap in an opening direction.

In a further embodiment, the enclosure has a top part and a bottom part that latch together via latching points to form the enclosure, where the top part is configured in a U-shaped at the first end and a first web and a second web is formed thereby, and the first opening is configured in the first web and the second web is configured with a bearing journal which interacts with a bearing receiver in the first hinge piece.

For an electrical connection between the housing and the cover of the electronic module, the electronic module is advantageously configured such that a foil-insulated flat conductor is disposed between the housing and the cover.

To configure the electrical connection produced by the flat conductor between the housing of the module and the cover as load-carrying and each time to permit a rotary movement of the cover to the housing during operation of an electronic module, it is particularly advantageous if the foil-insulated flat conductor has a first conductor part and a second conductor part and if the first conductor part is connected via a cross-piece to the second conductor part, where the first conductor part is disposed in a first half rotation and the second conductor part is disposed in a second half rotation around the axis of rotation of the hinge, and the cross-piece is disposed parallel to the axis of rotation of the hinge and perpendicular to a longitudinal direction of the first and second conductor parts.

In design terms the presently contemplated embodiment now creates a force-fit and simultaneously electrical, movable connection between the housing of the electronic module and the cover. Owing to the embodiment with the axial casing disposed in the first opening it is possible to achieve a force-fit, torque-resistant mechanical connection and simultaneously an electrical connection on the same axial space.

To achieve this technical effect, the foil-insulated flat conductor is configured such that the first half rotation of the first conductor part is guided in a groove disposed around the second opening of the first hinge piece and the second half rotation of the second conductor part is guided in a reservoir that is formed by a covering tongue disposed at the bottom part and a guide channel disposed at the top part partially around the first opening. Owing to this design measure and shaping of the housing parts of both components to be connected (e.g., housing of the module, cover), the requisite hinge pieces can be accommodated inside the same axial space. The hinge consists as it were of a fixed and a movable part between which a torque is generated by frictional forces. The fixed part fits into a receptacle of the housing of the electronic module; the movable part fits into a receptacle of the enclosure of the cover. The foil-insulated flat conductor is disposed radially around the hinge and transforms, at a defined distance from the axis of rotation, from the housing of the electronic module into the enclosure of the cover. Owing to the housing of the electronic module the foil-insulated flat conductor is retained. As a result of the enclosure of the cover, the foil-insulated flat conductor is guided during the rotary movement.

In a further embodiment, a switching device for operating the module is disposed in the cover configured as a movable front flap.

In a further improved embodiment, a display for monitoring the module is disposed in the cover configured as a movable front flap.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawings show one possible exemplary embodiment of an electronic module with a cover, in which:

FIG. 6 shows a perspective view of a foil-insulated flat conductor.

DETAILED DESCRIPTION OF THE PREFERRED EMBODIMENTS

Figure 1:
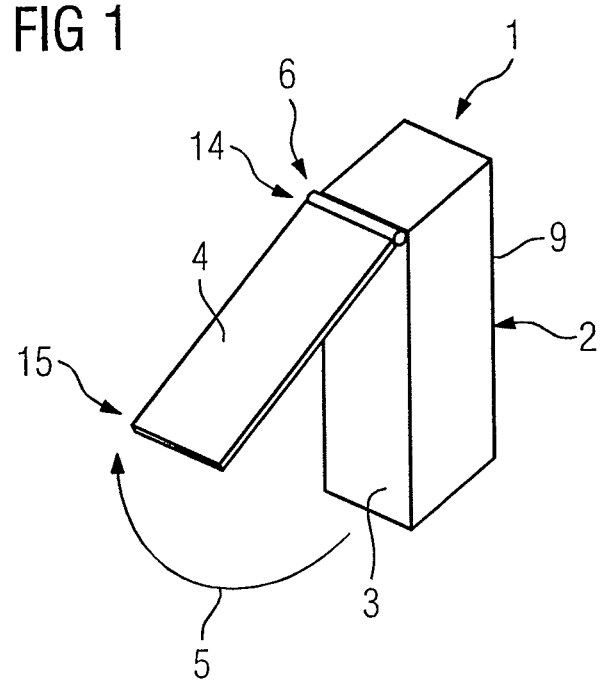
FIG. 1 shows a schematic, perspective view of an electronic module.

FIG. 1 shows an electronic module 1 for automation engineering with a housing 9, a back 2 and a front 3. A cover 4 is rotatably disposed in a top region 6 of the front 3. The cover 4 can be moved away from the electronic module 1 in an opening direction 5. The cover 4 has a first end 14 and a second end 15.

Figure 2:
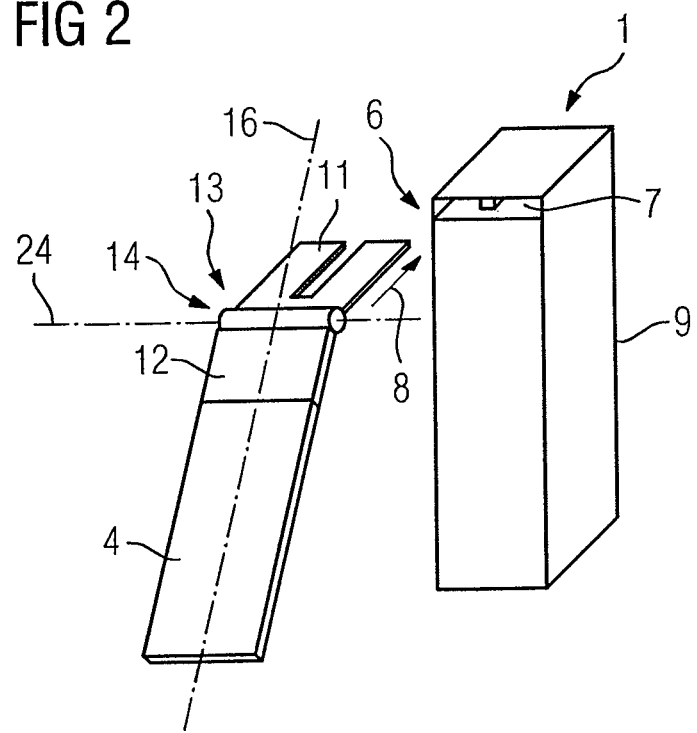
FIG. 2 shows a schematic, perspective view of an electronic module with a cover, which can be inserted into the housing of the electronic module via a hinge piece.

FIG. 2 depicts the electronic module 1 with the cover 4 in a split illustration. The cover 4 has a hinge 13 at its first end 14. The hinge 13 comprises a first hinge piece 11 and a second hinge piece 12. The first hinge piece 11 is configured such that it can be inserted in an insertion direction 8 into a receptacle 7 of the housing 9 of the electronic module 1. An axis of rotation 24 of the hinge is formed at the point where the first hinge piece 11 and the second hinge piece 12 come together.

Figure 3:
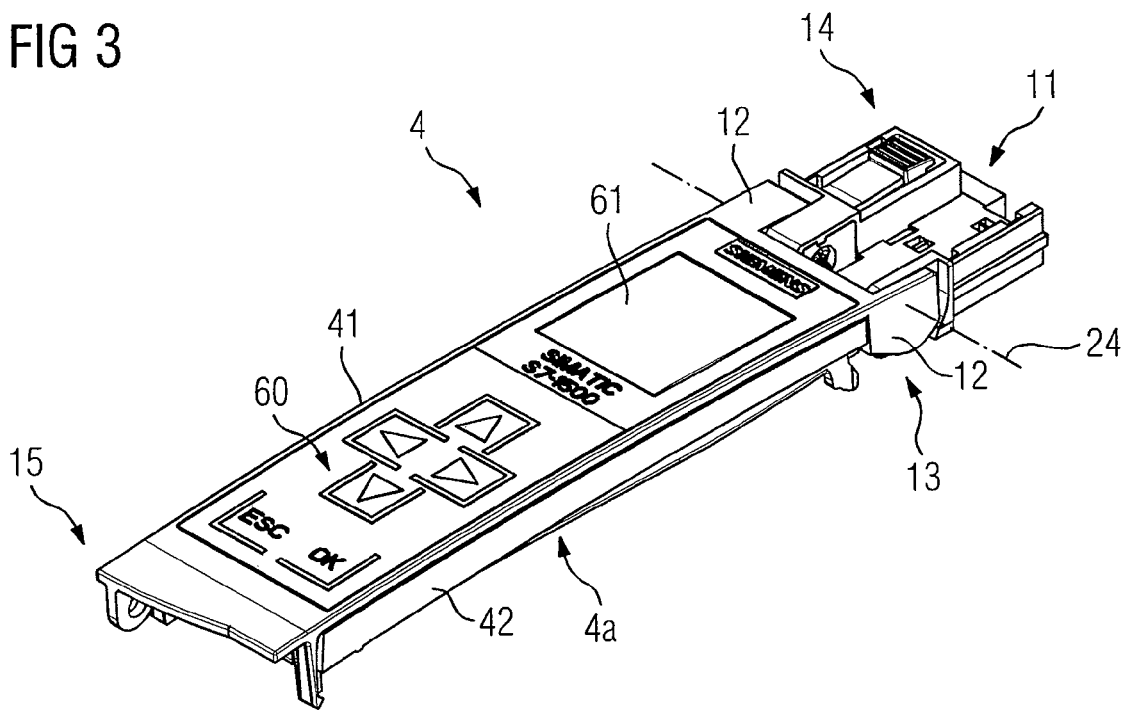
FIG. 3 shows a perspective view of a cover with a switching device and a display.

FIG. 3 illustrates here the cover of FIG. 1 and FIG. 2 in greater detail. Here, the cover 4 has an enclosure 4a, in which a switching device 60 and a display 61 are disposed. The switching device 60 is disposed in the region of the second end 15 of the cover 4 and has a control cross, an Escape key and an OK key. The display 61 is disposed in the region of the first end 14 of the cover 4. The first end 14 of the cover 4 is configured as the second hinge piece 12 into which the first hinge piece 11 is fitted. The hinge pieces 11 and 12 form an axis of rotation 24 of the hinge. FIG. 3 shows the cover 4 in a view of a top part 41 of the cover 4.

Figure 4:
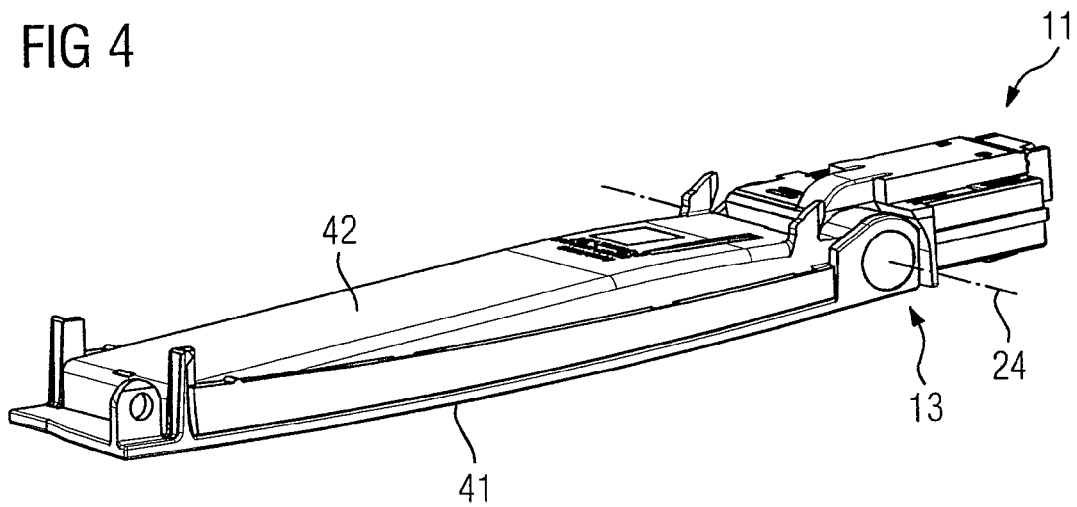
FIG. 4 shows the cover shown in FIG. 3 in a view from below.

FIG. 4 illustrates a bottom part 42 of the cover 4.

Figure 5:
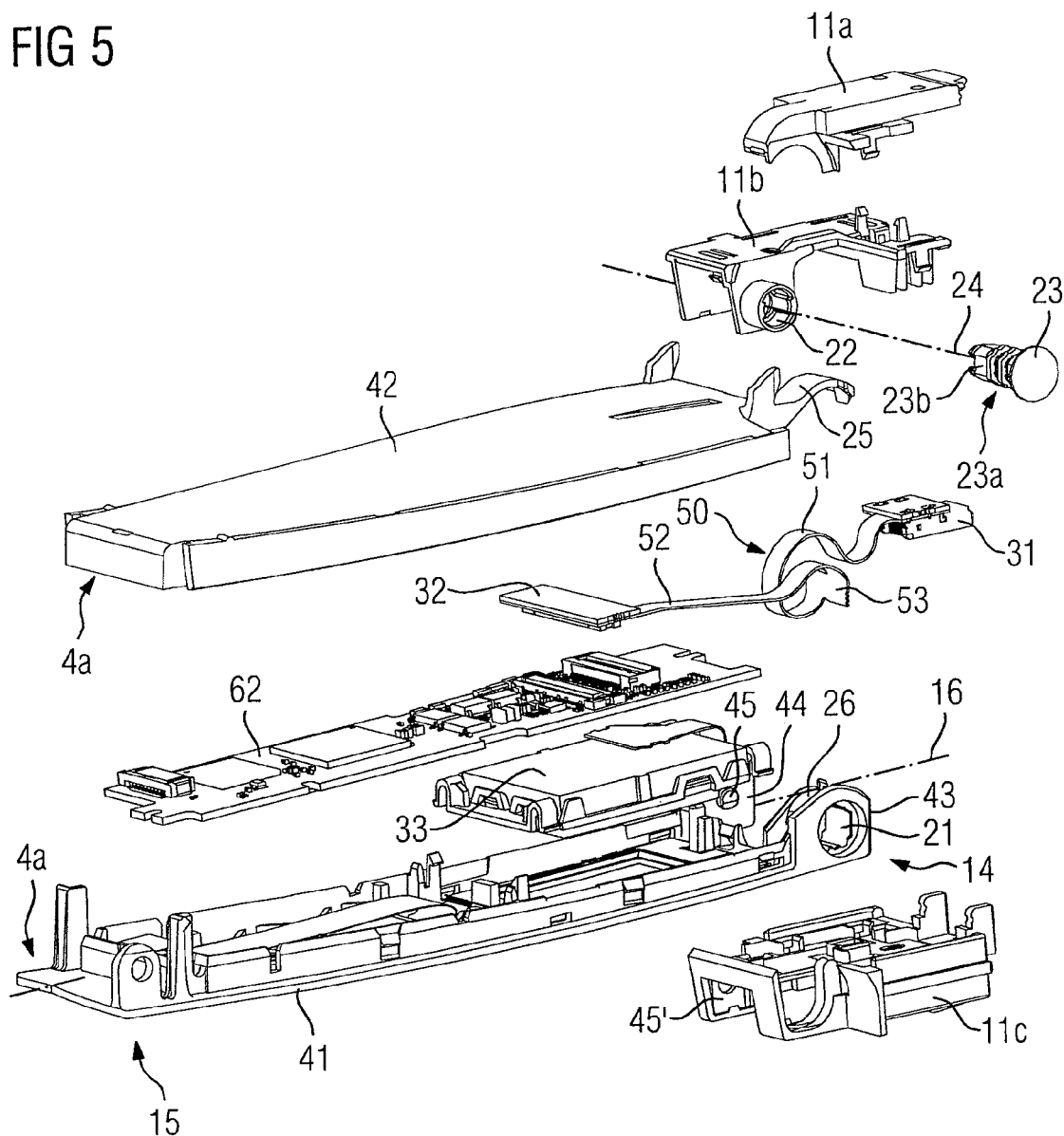
FIG. 5 shows the cover from FIG. 3 and FIG. 4 in an exploded view.

FIG. 5 elucidates the overall structure of the cover 4 in the embodiment of a cover enclosure with electronic parts and components in an exploded view. The first hinge piece 11 comprises a cover part 11a, a central part 11b and a frame part 11c. Disposed in the central part 11b is a second opening 22 that corresponds to a first opening 21 which in turn is disposed inside the second hinge piece 12 of the cover 4. The second hinge piece 12 is configured such that the enclosure 4a of the cover 4, which comprises a top part 41 and a bottom part 42, has a first web 43 and a second web 44 at the first end 14 of the cover 4, in other words at the top part 41, as a result of which the first end 14 is configured as U-shaped. The first opening 21 is disposed in the first web 43 and the second web 44 has a bearing journal 45 that interacts with a bearing receiver 45' in the first hinge piece 11.

A foil-insulated flat conductor 50 with a first conductor part 51 and a second conductor part 52 is disposed inside the enclosure 4a of the cover 4. The first conductor part 52 is connected to the second conductor part 52 via a cross-piece 53. The first conductor part 51 is disposed in a first half rotation 54 (see also FIG. 6) and the second conductor part 52 is disposed in a second half rotation 55 around the axis of rotation 24 of the hinge. The cross-piece 53 is disposed parallel to the axis of rotation 24 of the hinge and perpendicular to a longitudinal direction of the first and second conductor parts 51,52. A display unit 33 is disposed in the top part 41. A printed-circuit board 62 is disposed between the bottom part 42 and the display unit 33. When all components are plugged together and in particular the bottom part 41 and the top part 42 are latched together using detents, the hinge 13 formed from the first hinge piece 11 and the second hinge piece 12 can be made operative via an axial casing 23. The axial casing 23 has a first partial region 23a and a second partial region 23b. The first partial region 23a of the axial casing 23 is inserted into the first opening 21 and the second partial region 23b of the axial casing 23 is inserted into the second opening 22 and thus forms a force-fit, stable-torque hinge connection.

To connect the printed-circuit board 62 to an electronic component inside the housing of the electronic module 1 via the foil-insulated flat conductor 50, the foil-insulated flat conductor 50 has a first connector 31 at a first end and a second connector 32 at a second end.

FIG. 6 shows the foil-insulated flat conductor 50 in a perspective view. The foil-insulated flat conductor 50 comprises a first conductor part 51 and a second conductor part 52, which are connected to one another via a cross-piece 53. In order to create a permanently rotatable transition from the housing of the electronic module to the cover 4, the foil-insulated flat conductor 50 is configured such that the first conductor part 51 is disposed in a first half rotation 54 and the second conductor part 52 is disposed in a second half rotation 55 around the axis of rotation 24 of the hinge and perpendicular to a longitudinal direction of the first and second conductor parts 51,52. In the assembled state (see FIG. 5), the first half rotation 54 of the first conductor part 51 is guided in a groove disposed around the second opening 22 of the first hinge piece 11 and the second half rotation 55 of the second conductor part 52 is guided in a reservoir formed by a covering tongue 25 disposed at the bottom part 42 and a guide channel 26 disposed at the top part 41 partially around the first opening 21.

Thus, while there have shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An electronic module for automation engineering, comprising:
   a housing;
   a back configured with a retaining device for latching in a support system;
   a front;
   a movable cover connected to the housing and disposed at the front;
   a receptacle disposed in a top region of the front of the housing, the receptacle being configured to receive a first hinge piece of a hinge, with a latching mechanism, connecting the housing and the movable cover, the movable cover being configured at a first end as a second hinge piece of the hinge, a first opening being disposed perpendicular to a longitudinal axis of the cover at the first end in an enclosure of the cover, an axial casing being inserted into the first opening, the first hinge piece having a second opening into which a partial region of the axial casing is inserted to form an axis of rotation of the hinge, the cover being rotatable as a movable front flap in an opening direction; and
   a foil-insulated flat conductor disposed between the housing and movable cover and including a first conductor part and a second conductor part, the first conductor part being connected to the second conductor part via a cross-piece, the first conductor part being disposed in a first half rotation and the second conductor part being disposed in a second half rotation around an axis of rotation of the hinge, and the cross-piece being disposed parallel to the axis of rotation of the hinge and perpendicular to a longitudinal direction of the first and second conductor parts.

2. The electronic module as claimed in claim 1, wherein the enclosure of the cover comprises a top part and a bottom part which latch together via latching points to form the enclosure, the top part being configured as U-shaped at the first end such that a first web and a second web are formed, the first opening being disposed in the first web and the second web being configured with a bearing journal which interacts with a bearing receiver in the first hinge piece.

3. The electronic module as claimed in claim 1, wherein the first half rotation of the first conductor part is guided in a groove disposed around the second opening of the first hinge piece and the second half rotation of the second conductor part is guided in a reservoir formed by a covering tongue disposed at the bottom part and a guide channel disposed at the top part partially around the first opening.

4. The electronic module as claimed in claim 1, further comprising:
    a switching device for operating the module and disposed in the cover configured as the movable front flap.

5. The electronic module as claimed in claim 1, further comprising:
    a display for monitoring the module and disposed in the cover configured as the movable front flap.

\* \* \* \* \*